(12) United States Patent
Vavrek et al.

(10) Patent No.: US 7,171,254 B2
(45) Date of Patent: Jan. 30, 2007

(54) RF COIL EMBEDDED WITH HOMOGENEITY ENHANCING MATERIAL

(75) Inventors: Robert M. Vavrek, Waukesha, WI (US); Ceylan C. Guclu, Waukesha, WI (US); Phillip E. Steen, Delafield, WI (US)

(73) Assignee: General Electric Company, Schenectady, NY (US)

( * ) Notice: Subject to any disclaimer, the term of this patent is extended or adjusted under 35 U.S.C. 154(b) by 588 days.

(21) Appl. No.: 10/249,208

(22) Filed: Mar. 21, 2003

(65) Prior Publication Data

US 2004/0186375 A1  Sep. 23, 2004

(51) Int. Cl.
*A61B 5/05* (2006.01)

(52) U.S. Cl. ............... 600/422; 600/407; 600/410; 600/421

(58) Field of Classification Search ........... 600/421, 600/422; 324/309
See application file for complete search history.

(56) References Cited

U.S. PATENT DOCUMENTS

| | | | | |
|---|---|---|---|---|
| 5,210,265 A | * | 5/1993 | Clement et al. | ............ 558/230 |
| 5,339,033 A | | 8/1994 | Eilenberg et al. | |
| 5,414,358 A | * | 5/1995 | Eilenberg et al. | ........... 324/309 |
| 5,794,621 A | * | 8/1998 | Hogan et al. | ............... 600/407 |
| 5,865,177 A | | 2/1999 | Segawa | |
| 6,794,869 B2 | * | 9/2004 | Brittain | ..................... 324/309 |
| 2003/0216637 A1 | * | 11/2003 | Ho et al. | .................... 600/415 |

OTHER PUBLICATIONS

Research Disclosure, *RF Resonance Suppression by Dielectric Material*, XP-002296775, Feb. 10, 2001, No. 442005, disclosed anonymously.
Th. K.F. Foo et al., *Reduction of RF Penetration Effects in High Field Imaging*, Magnetic Resonance in Medicine, 23, 287-301 (1992).

* cited by examiner

*Primary Examiner*—Brian L. Casler
*Assistant Examiner*—Jacqueline Cheng
(74) *Attorney, Agent, or Firm*—Ziolkowski Patent Solutions Group, SC; Michael A. Della Penna; Carl B. Horton

(57) ABSTRACT

The present invention provides a system and method of improved homogeneity whereby at least a portion of an RF coil is filled with homogeneity enhancing material. Disposing the homogeneity enhancing material, such as perfluorocarbon, within the RF coil, implementation of thick saturation pads may be avoided altogether or thinner pads may be used to fill any voids between the patient and the coil. The present invention is particularly useful in a CTL coil assembly for acquiring diagnostic data of the neck region of a patient. However, the advantages achieved by the present invention may be incorporated into other surface coils for other anatomical regions where control of the susceptibility is desired. Additionally, the homogeneity enhancing material also acts as a heat sink for any hot spots on the coil.

22 Claims, 4 Drawing Sheets

RF COIL EMBEDDED WITH HOMOGENEITY ENHANCING MATERIAL

BACKGROUND OF INVENTION

The present invention relates generally to magnetic resonance (MR) imaging and, more particularly, to an RF coil embedded with homogeneity enhancing material such that an improved MR image of a subject may be reconstructed.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Magnetic resonance imaging (MRI) is generally predicated on the excitation of hydrogen atoms within the tissue. Human tissue typically has high water content and hydrogen is plentiful in water. Therefore, MR imaging based on scanning for hydrogen is typically preferred for diagnostic purposes. It is well known that in hydrogen MR imaging, tissues that have little or no hydrogen produce very little or no signal. Conversely, tissues or fatty regions with high hydrogen content are highly emissive and provide a strong MR signal. However, if the hydrogen content of the tissue is exceptionally high relative to nearby tissues, the resultant signal may overwhelm and mask the details of nearby tissues with less hydrogen content. This is particularly problematic when the lower hydrogen content tissues are diagnostically significant in the MR imaging session.

A number of imaging techniques have been developed to alleviate the aforementioned problem and are designed to separate the signals that are emitted from the various tissues subject to the MR imaging process. These methods include nullification of signals from certain tissues. One such method commonly referred to as "fat saturation" requires that the entire tissue be subjected to an off-resonance specific saturation pulse (off by 3.3 ppm). The saturation pulse "deactivates" the lipid portions of the tissue such that useful signals are not emitted from fat when the imaging portion of the data acquisition signal is applied.

For fat saturation to be effective, the homogeneity must be precise. If not, non-lipid tissues may be off resonance by several ppm and inadvertently "deactivated" by the off-resonance specific saturation pulse resulting in an incomplete and, potentially, unusable image. Additionally, MR imaging of the neck and shoulder regions of a patient is particularly susceptible to ineffective fat saturation as these regions of the patient often have more field inhomogeneity due to the geometry of the neck and/or shoulders. One method to address the limitations or imprecision of fat saturation in the neck and shoulder area includes the placement of a bag of water or non-protonated fluid around these regions of the patient. Water, which is highly protonated, however can create a bright signal in the resultant MR image, a disadvantage discussed above. Therefore, implementation of bags or containers of non-protonated fluids, such as fluorocarbons, is preferred.

Fluorocarbons have magnetic susceptibility properties similar to that of human tissue. They have been found to be highly effective in correcting the field inhomogeneity, thereby improving the ability to saturate only fat tissue. Specifically, hydrogen-depleted fluorocarbons have magnetic susceptibility properties similar to that of human tissue and since they have low hydrogen content, they do not contribute any signal to the MR image.

Specifically, bags of fluorocarboneceous material or "sat pads" when properly used can reduce the influence of the human body on the magnetic flux. The magnetic flux can be thought of as traveling down the magnet bore in the Z direction. When a subject is in the bore of an MR system, the tissue water content is diamagnetic and hence has an influence on the magnetic flux. Looking inwardly through the magnet bore, the cross section of the subject typically expands and contracts depending upon the anatomical location. This variation in cross-section has a small but significant influence on the magnetic flux. Wherever the magnetic flux direction and strength are altered by geometric changes of the subject, the homogeneity of the magnetic field decreases in those regions. For example, as will be discussed with respect to FIG. 7, coil assemblies are commonly constructed to include a protrusion or "bump" that acts a neck rest for a patient. Because it is desirable to minimize the distance between the patient and the RF coil, the RF coil elements are typically placed to match the contour of the neck rest. As a result, air volumes are formed in the coil assembly that can negatively affect magnetic flux. That is, magnetic flux traveling through the patient will encounter the air volumes and react differently from the interactions with the tissue water of the patient. As a result, the magnetic flux will change direction and negatively affect homogeneity. As a result, if the cross section variations could be diminished, the homogeneity would improve.

An alternative but less desirable implementation uses doped water with extremely rapid signal decay so as not to produce any significant signal during a typical NMR measurement. At least two disadvantages of doped water are its permittivity and electrical conductivity. The RF performance and safety of doped water are also problematic.

Notwithstanding the advantages achieved by sat pads, they can be problematic when acquiring imaging data from particular regions of the patient. For example and as shown in FIG. 7, when acquiring data from the neck region, a patient 1 is placed on a table 2 having an RF coil assembly and that includes a protrusion 3 extending therefrom. The protrusion 3 serves as support for the neck 4 of the patient 1, but also houses an RF coil (not shown). By enclosing the coil within the protrusion 3, the coil may be positioned closer to the neck which improves reception signal strength and, ultimately, results in a better diagnostic image. Placing a sat pad 5 on an upper end 6 of the protrusion 3 to reduce changes in cross-section between the torso and the neck of the patient causes the curvature 7 of the neck 4 to be exaggerated and thereby defeats the intent of minimizing contour changes. Additionally, placement of the sat pad 5 increases the distance d between the RF coil and the neck which can decrease the signal strength detected by the coil.

It would therefore be desirable to have a system and method capable of improving fat saturation with a homogeneity enhancing material that does not result in an exaggeration of anatomical contours of the patient or increases the distance between the patient and the RF coil.

BRIEF DESCRIPTION OF INVENTION

The present invention provides a system and method of improved magnetic field homogeneity overcoming the aforementioned drawbacks whereby at least a portion of an RF coil assembly is filled with homogeneity enhancing fluid to eliminate air volumes within the coil assembly thereby improving cross-sectional consistency of the coil assembly and a subject positioned thereon. As a result of disposing the homogeneity enhancing fluid, such as perfluorocarbon, within the RF coil, implementation of thick saturation pads may be avoided altogether or thinner pads may be used to fill any voids between the patient and the coil. The present invention is particularly useful in a cervical-thoracic-lumbar (CTL) coil assembly for acquiring diagnostic data of the neck region of a patient. However, the advantages achieved by the present invention may be incorporated into other surface coils for other anatomical regions where susceptibility induced field inhomogeneity needs to be addressed. Additionally, perfluorocarbon also acts as a heat sink reducing the peak temperature of any thermal hot spots on the coil.

Therefore, in accordance with one aspect of the present invention, an apparatus to acquire spatially encoded signals for MR imaging with improved homogeneity includes an RF coil to acquire imaging data from a subject disposed within an imaging volume. The RF coil is disposed within a housing. A homogeneity enhancing material is disposed within a portion of the housing.

According to another aspect of the present invention, an MRI apparatus includes a plurality of coils positioned about a bore of a magnet to impress a polarizing magnetic field, and an RF transceiver system. An RF switch is controlled by a pulse module to transmit RF signals to an RF coil assembly having at least one RF coil to acquire MR images. A homogeneity enhancing fluid is disposed within a portion of the RF coil assembly to improve the success of homogeneity sensitive applications such as fat saturation in the subject during MR image acquisition.

In accordance with a further aspect of the present invention, a method of MR imaging with improved homogeneity includes the step of placing a subject within a bore of a magnet of an MRI system. A homogeneity enhancing material is disposed within a portion of an RF coil designed to acquire imaging data from at least a portion of the subject. The method also includes the step of acquiring imaging data from at least a portion of the subject. An MR image is then reconstructed of at least a portion of the subject from the acquired imaging data.

Various other features, objects and advantages of the present invention will be made apparent from the following detailed description and the drawings.

BRIEF DESCRIPTION OF DRAWINGS

The drawings illustrate one preferred embodiment presently contemplated for carrying out the invention.

In the drawings.

DETAILED DESCRIPTION

Figure 1:
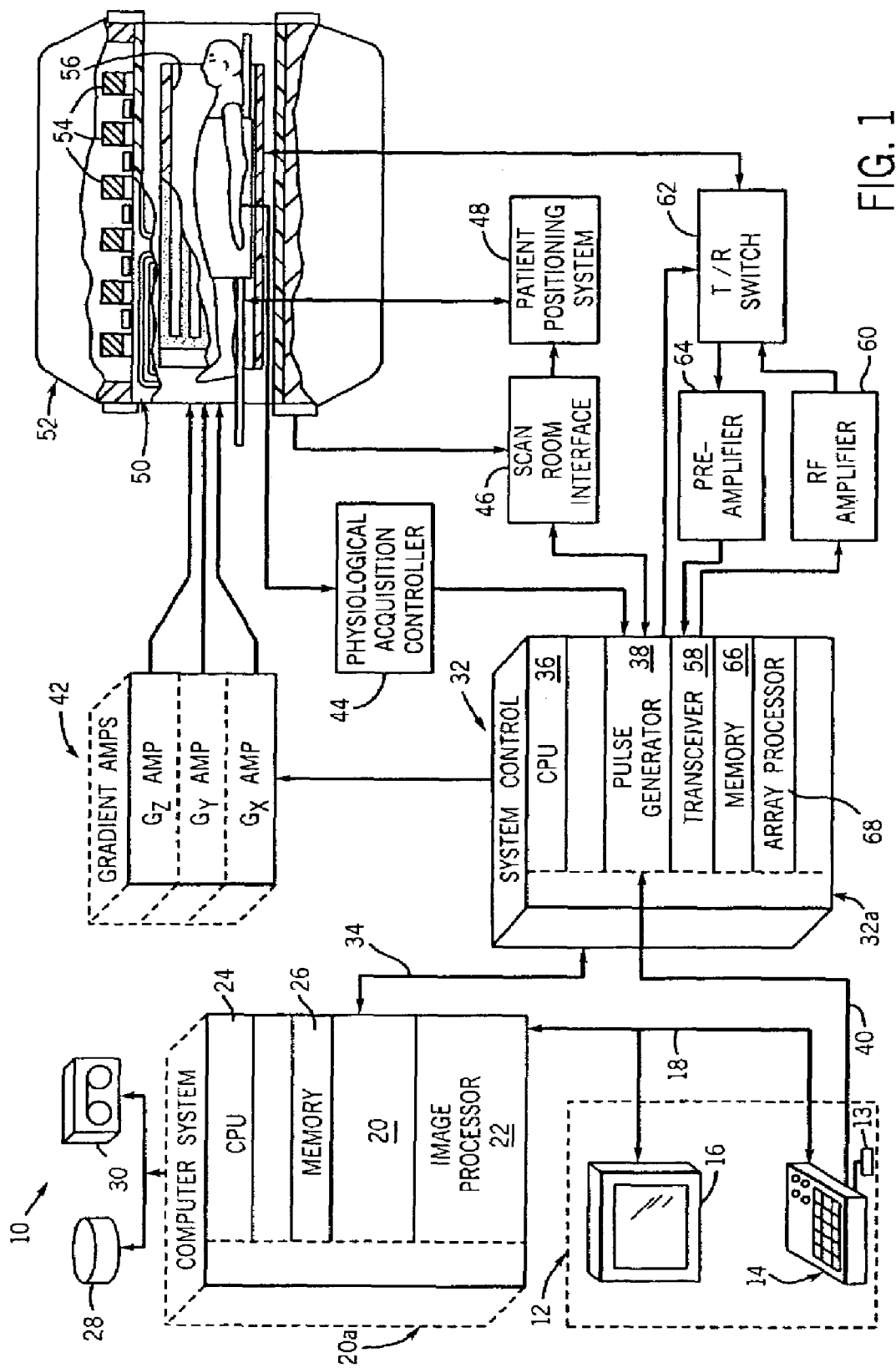
FIG. 1 is a schematic block diagram of an MR imaging system for use with the present invention.

Referring to FIG. 1, the major components of a preferred magnetic resonance imaging (MRI) system 10 incorporating the present invention are shown. The operation of the system is controlled from an operator console 12 which includes a keyboard or other input device 13 a control panel 14, and a display screen 1 6. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in a gradient coil assembly 50 designated to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the coil 56 to the preamplifier 64 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

The present invention is directed to MR imaging with improved homogeneity wherein at least a portion of an RF coil housing is filled with homogeneity enhancing material. The present invention is particularly useful in a cervical-thoracic-lumbar (CTL) coil assembly for acquiring diagnostic data of the neck region of a patient and will be described relative thereto. However, the advantages achieved by the present invention may be incorporated into other surface coils for other anatomical regions where control of the susceptibility is desired.

Figure 2:
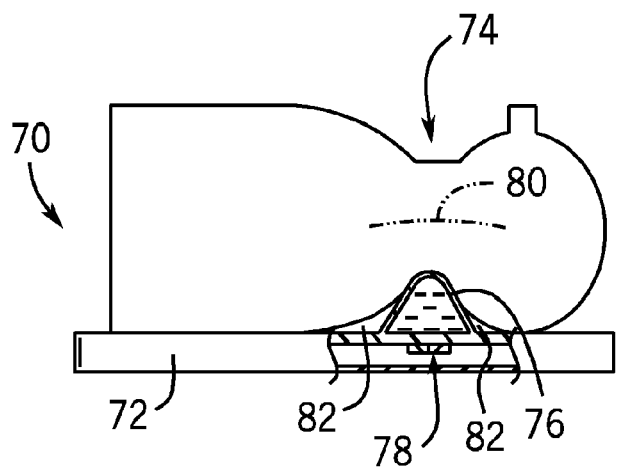
FIG. 2 is a schematic of a patient positioned on an RF coil assembly.

Referring now to FIG. 2, a patient 70 is schematically shown on a surface coil assembly 72 for an MR imaging session to acquire and reconstruct diagnostic images of a neck region 74 of the patient 70. Assembly 72 includes a protrusion 76 to support the patient's neck. Supporting the neck of the patient is critical to minimize patient motion and not stress the spine. It also reduces anxiety in the patient by making the patient as comfortable as possible. MRIs are performed for a number of reasons but chiefly to acquire diagnostic data so that a medical diagnosis/prognosis can be effectively rendered. Therefore, the patient typically is anxious about the process and every effort is made to ease any concerns the patient may have as well as make the patient as comfortable as possible. The protrusion also serves to provide support for the neck so that the patient is less likely to move during the imaging process. Movement during data acquisition can result in increased artifacts in the final reconstructed image.

Figure 7:
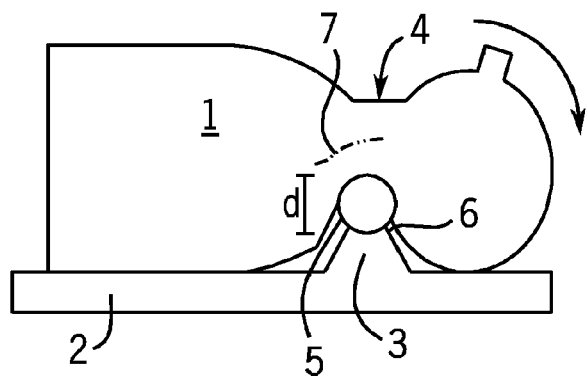
FIG. 7 is a schematic of a patient positioned on a known RF coil assembly.

As described above, a whole body RF coil transmits RF signals to the patient. A separate coil assembly 72 is then used to receive RF signals emitted from the patient. A portion of the separate coil assembly may be enclosed within protrusion 76. Specifically, coil 78 is positioned within the protrusion and is configured to receive the resulting signals emitted by the excited nuclei in the patient. In the illustrated embodiment, coil 78 corresponds to that portion of a CTL coil designed to receive RF signals from the neck region of the patient. RF coil 78 is housed within protrusion 76 so the coil may be positioned as close as reasonably possible to the neck region of the patient. This placement improves RF field homogeneity thereby improving image quality. Further, placement of coil 78 in protrusion 76 allows the neck region of the patient to be positioned closer to the receive coil 78 such that signal strength and RF homogeneity are improved. Patient 70 is shown positioned on surface coil assembly 72 with the neck region being supported by protrusion 76. Typically, this orientation requires placement of a saturation pad between the patient and the protrusion, as discussed with reference to FIG. 7. As stated previously, the pad is filled with either water or fluorocarbons and is used to improve homogeneity. However, the prior art pad causes an exaggeration of the patient's cervical spine 80 which is not desirable.

RF surface coil assembly 72 is a relatively rigid structure designed to support a patient or other imaging subject and is configured such that homogeneity enhancement material, i.e. fluid or gel, is disposed therewithin. Disposing the material within the coil assembly maintains a desirable distance between the patient and the coil and does not result in an exaggerated curving of the patient's spine. To further improve homogeneity, smaller saturation pads may be placed in voids 82. Placement of smaller pads within these voids does not increase the distance between the patient and the coil assembly 72 nor do they exaggerate the cervical spinal region of the patient. Moreover, placement of sat pads in voids 82 is advantageous as skin-air interfaces are minimized.

Figure 3:
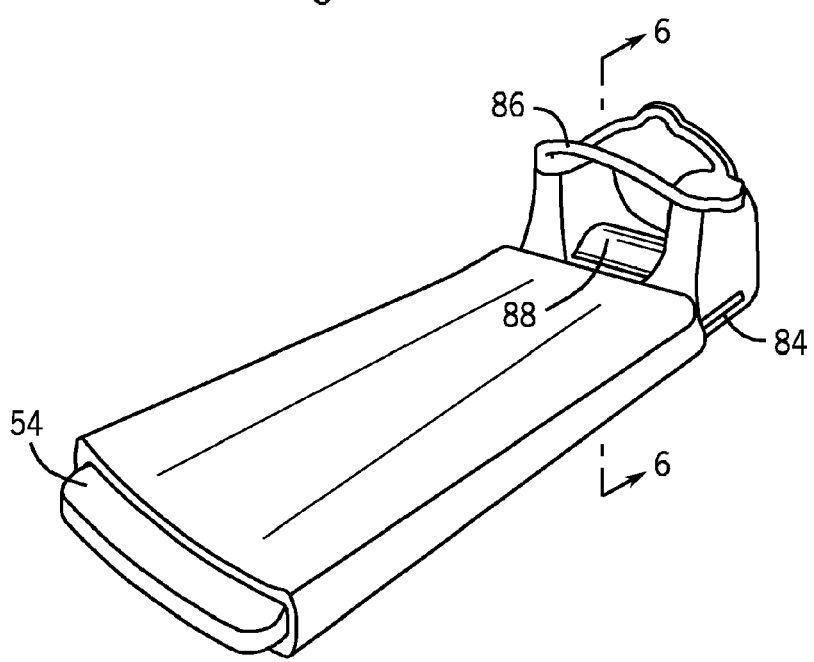
FIG. 3 is a perspective view of an RF coil assembly in accordance with present invention.

Referring now to FIG. 3, an RF surface coil assembly is shown without a patient thereon but configured to receive and together with a moveable table position a patient within an imaging volume for MR data acquisition and image reconstruction. The RF coil assembly 72 is positioned within housing 84 defining a cavity that encloses the coil(s) and the various electronic components associated with operation of the coil assembly 72. The housing includes coil 86 configured to acquire MR data of the upper spinal region of a patient and a protrusion 88 for supporting the neck region of the patient as was discussed above. FIG. 3 shows is a typical RF surface coil for acquiring imaging data from the cervical, thoracic, and lumbar regions of the patient.

Figure 4:
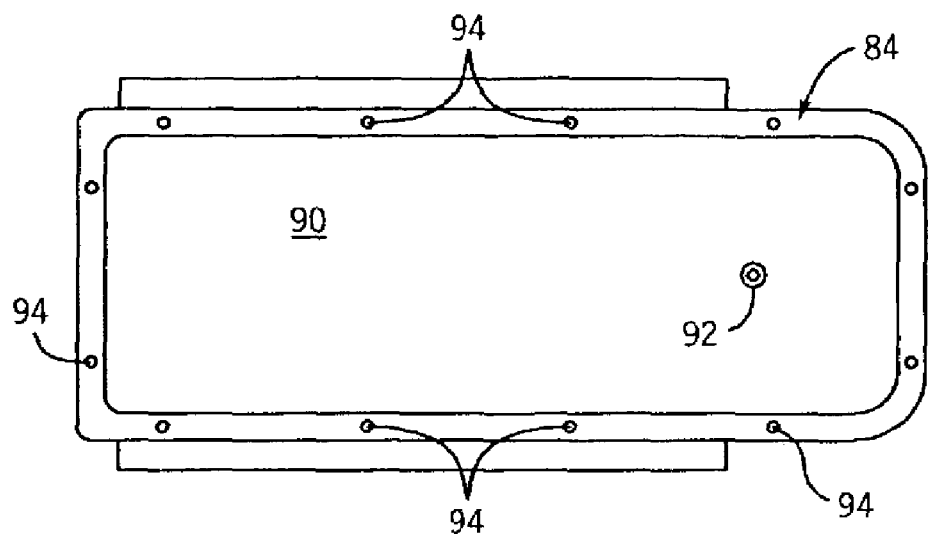
FIG. 4 is a bottom view of that shown in FIG. 3.

A bottom view of the RF coil assembly is shown in FIG. 4 with a bottom cover or plate 90 being affixed to housing 84 to secure and protect the various electronic components as well as the coils within housing 84. Cover 90 includes a drain plug 92 or valve for removing, from the coil assembly, homogeneity enhancing material in a controlled manner. As such, the homogeneity enhancing material may be drained from the assembly without the material being lost as it floods from the assembly as a technician or other service engineer removes the cover 90 from housing 84. By controlling the removal of the homogeneity enhancing material, a safe and clean working area may be maintained for the technician to work in when servicing the RF coil assembly. Cover 90 is secured to housing 84 via screws 94 that may be removed to dislodge cover 90 from housing 84 to access the internal electronic components and coils of the RF coil assembly.

Alternately, cover 90 may comprise a number of plates that collectively enclose the components of the coil assembly. Accordingly, the internal volumes of the coil assembly may be partitioned using partition walls or plates (not shown) such that the homogeneity enhancing fluid is contained within a particular section or partition of the coil housing. As such, the cover plate(s) used to close the partitions having the homogeneity fluid may be independently removed or constructed to include a drain plug. With this alternate construction, the homogeneity enhancing material may be removed without having to remove the entire bottom cover from the coil housing.

Figure 5:
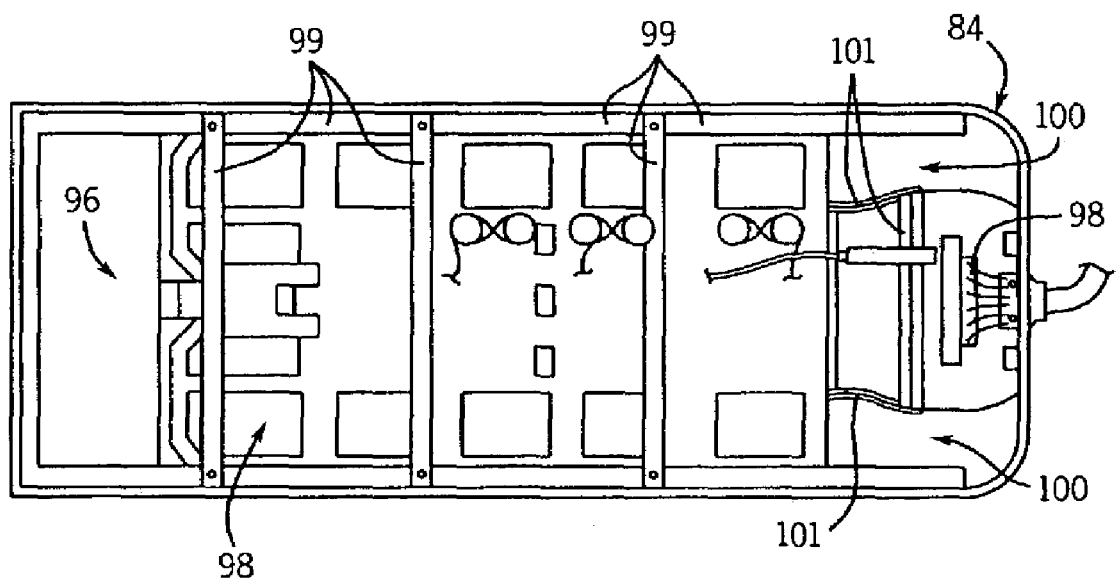
FIG. 5 is a bottom view of the RF coil assembly of FIG. 3 with the bottom cover removed.

FIG. 5 is a view of the RF coil assembly with the bottom cover 90 of the housing 84 removed. With the bottom cover removed, the cavity 96 of the coil assembly and the various electronic components 98 as well as coils 99 and 101 are shown. The cavity 96 includes interior volumes 100 designed to receive homogeneity enhancing material. Volumes 100 are located near the head of the coil assembly and thereby correspond to the neck regions of the patient. The volumes 100 are particularly well suited for receiving the homogeneity enhancing material as the topography or contour of the coil assembly at the head end defines a collection region. Specifically, the height of the housing at this end of the assembly is greater thereby resulting in deeper volumes 100 that allows the homogeneity enhancing material to be disposed in relative proximity to the patient.

Figure 6:
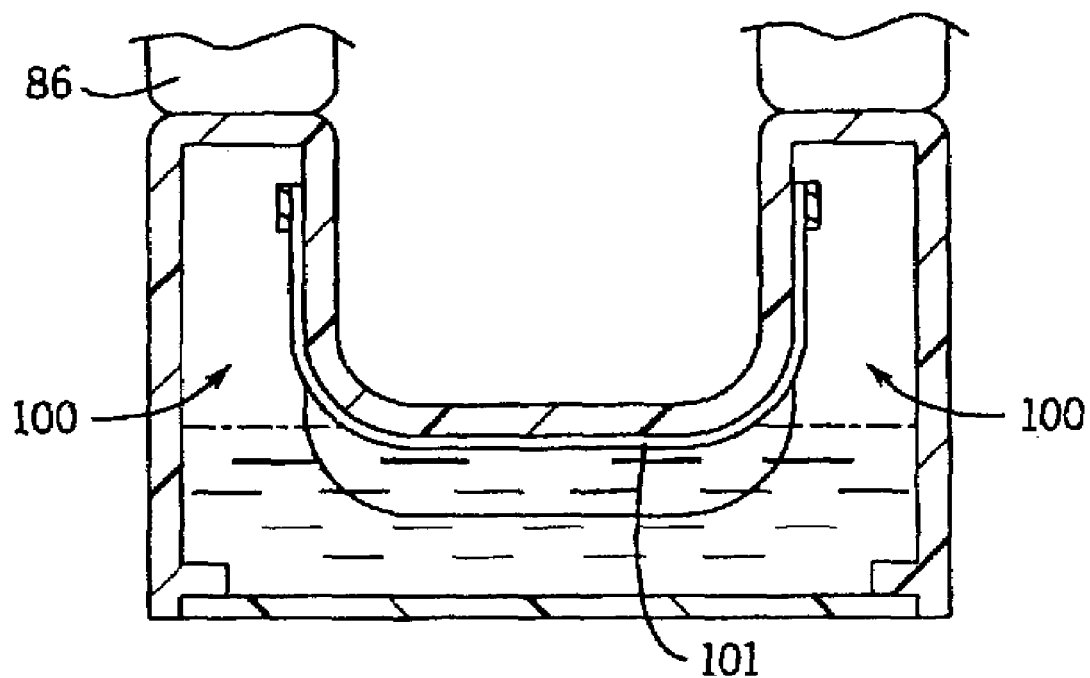
FIG. 6 is a cross-sectional view taken along line 6—6 of FIG. 3.

Referring now to FIG. 6, the interior volumes 100 are readily apparent as being positioned about coil 101. FIG. 6, which is a cross-sectional view taken along line 6—6 of FIG. 3, illustrates an advantage of this construction in that homogeneity material may be positioned so as to fill or partially fill volumes 101. By at least partially filling volumes 100, the air typically positioned between the patient and the patient table can be minimized and, preferably, eliminated. As a result, magnetic flux traveling through the patient and coil is relatively homogeneous.

The homogeneity enhancing material may selectively pumped from a reservoir (not shown) by pump (not shown). By selectively disposing the material within the coil, several anatomical regions can be saturated without requiring different coils. Also, the location as well as the degree of homogeneity enhancement may be controlled. Furthermore, for those imaging sessions where homogeneity in the neck region is not needed or during downtime of the MRI system, the material can be maintained remotely from the system. As such, a portable reservoir (not shown) may be used so that a fixed quantity of the homogeneity material can be used with more than one MRI system within a single imaging facility. Alternately, the bottom cover of the housing may be fitted with drain plug 92 or valve for draining the coil assembly of the homogeneity enhancing material for storage, disposal and replacement. Removal of the material is also desirable during servicing of the RF coil assembly so that the material is not uncontrollably allowed to exit the housing when the cover is removed.

Perfluorocarbon such as FC-77 is particularly well suited for disposal within the RF coil as its high electrical resistivity and its low dielectric constant allows the material to be placed within the coil without affecting the RF coil's performance. A number of other perfluorocarbons may utilized such as FC-87, FC-72, FC-84, FC-3283, FC-40, FC-43, and FC-70. The perfluorocarbon may take the form of either a liquid or a gel. The characteristics of these perfluorocarbons are such that it may also serve to cool hotspots (areas of high temperature) on the RF coil. As such, the homogeneity enhancing material may act as a heat sink thereby absorbing heat from the coil and spreading it out across the entire volume of the material.

Alternately, doped water may be used as a homogeneity enhancing material. However, doped water may negatively affect operation of the electronic components of the coil assembly. More particularly, precautions must be taken to encapsulate the RF components to protect against conductivity of the water. Encapsulation increases the difficulty of repairing individual RF components. Nevertheless, doped water may be preferred in some implementations where encapsulation is minimal.

The present invention has been described with respect to a CTL coil assembly; however, the present invention is not so limited. The present invention is equivalently applicable with other coil assemblies including, but not limited to receive-only coils and transmit-receive coils. For example, the present invention is equivalently applicable with a transmit-receive knee coil that is typically used to image both the knee and foot regions of a patient. A knee coil as well as coils for other anatomical regions are contemplated and within the scope of this invention.

Therefore, in accordance with one embodiment of the present invention, an apparatus to acquire spatially encoding signals for MR imaging with improved homogeneity includes an RF coil to acquire imaging data from a subject disposed within an imaging volume. The RF coil is disposed within a housing. A homogeneity enhancing material is disposed within a portion of the housing.

According to another embodiment of the present invention, an MRI apparatus includes a plurality of coils positioned about a bore of a magnet to impress a polarizing magnetic field and an RF transceiver system. An RF switch is controlled by a pulse module to transmit RF signals to an RF coil assembly having at least one RF coil to acquire MR images. A homogeneity enhancing fluid is disposed within a portion of the RF coil assembly to saturate fat in the subject during MR image acquisition.

In accordance with a further embodiment of the present invention, a method of MR imaging with improved homogeneity includes the step of placing a subject within a bore of a magnet of an MRI system. A homogeneity enhancing material is disposed within a portion of an RF coil designed to acquire imaging data from at least a portion of the subject. The method also includes the step of acquiring imaging data from at least a portion of the subject. An MR image is then reconstructed of at least a portion of the subject from the acquired imaging data.

The present invention has been described in terms of the preferred embodiment, and it is recognized that equivalents, alternatives, and modifications, aside from those expressly stated, are possible and within the scope of the appending claims.

What is claimed is:

1. An apparatus to acquire spatially encoded signals for MR imaging with improved homogeneity, the apparatus comprising:
   an RF coil assembly to acquire imaging data from a subject disposed within an imaging volume, the RF coil assembly having an RF coil and a plurality of electronic components;
   a housing enclosing the RF coil and the plurality of electronic components; and
   a homogeneity enhancing material interspersed within the housing and in contact with the RF coil and the plurality of electronic components.

2. The apparatus of claim 1 wherein the RF coil is configured to acquire imaging data from at least one of a cervical, a thoracic, and a lumbar region of the subject.

3. The apparatus of claim 1 wherein the homogeneity enhancing material includes one of a gel and a liquid.

4. The apparatus of claim 1 wherein the homogeneity enhancing material includes a material having a susceptibility similar to water.

5. The apparatus of claim 4 wherein the homogeneity enhancing material includes a material of low hydrogen content.

6. The apparatus of claim 4 wherein the homogeneity enhancing material includes a perfluorocarbon material.

7. The apparatus of claim 6 wherein the perfluorocarbon material includes fluorocarbon-77.

8. The apparatus of claim 6 incorporated into a surface coil assembly forming a patient table.

9. An MRI apparatus comprising:
a plurality of gradient coils positioned about a bore of a magnet to impress a polarizing magnetic field;
an RF transceiver system;
an RF switch controlled by a pulse module to transmit RF signals to an RF coil assembly having at least one RF coil to acquire MR images, the RF coil assembly disposed in a rigid housing; and
a homogeneity enhancing fluid having a low dielectric constant disposed within the rigid housing to improve homogeneity during MR image acquisition.

10. The MRI apparatus of claim 9 further comprising a moveable table configured to removeably position the subject within the bore of the magnet and wherein the table supports the RF coil assembly.

11. The MRI apparatus of claim 10 wherein the rigid housing includes a protrusion extending from a top surface thereof and wherein the protrusion is configured to be positioned underneath a neck region of the subject.

12. The MRI apparatus of claim 11 wherein the RF coil is an RF surface coil.

13. The MRI apparatus of claim 12 wherein the RF surface coil is an RF CTL coil.

14. The MRI apparatus of claim 9 wherein the homogeneity enhancing fluid is one of a liquid and a gel.

15. The MRI apparatus of claim 9 wherein the homogeneity enhancing fluid includes a perfluorocarbon fluid.

16. The MRI apparatus of claim 9 wherein the homogeneity enhancing fluid is configured to cool the RF coil during MR image acquisition.

17. A method of MR imaging with improved homogeneity comprising the steps of:
placing a subject within a bore of magnet of an MRI system;
selectively positioning homogeneity enhancing material within a portion of an RF coil housing based on a portion of the subject to be imaged, the RF coil housing having an RF coil in contact with the homogeneity enhancing material and designed to acquire imaging data from the subject;
acquiring imaging data from the subject; and
reconstructing an MR image of the subject from the acquired imaging data.

18. The method of claim 17 wherein the step of acquiring imaging data includes the step of acquiring imaging data from at least one of a cervical, a thoracic, and a lumbar region of the subject.

19. The method of claim 17 wherein the homogeneity enhancing material includes one of a perfluorocarbon fluid and a perfluorocarbon gel.

20. The method of claim 17 wherein the RF coil housing is supported by a table designed to removeably position the subject within the bore of the magnet.

21. The method of claim 20 further comprising the step of acquiring the imaging data without a saturation pad positioned between the subject and the RF coil housing.

22. The method of claim 17 further comprising the step of removing the homogeneity enhancing material from the RF coil housing upon completion of an MR scan.

* * * * *